United States Patent
Yu

(10) Patent No.: US 6,255,174 B1
(45) Date of Patent: *Jul. 3, 2001

(54) MOS TRANSISTOR WITH DUAL POCKET IMPLANT

(75) Inventor: Bin Yu, Sunnyvale, CA (US)

(73) Assignee: Advanced Micro Devices, Inc., Sunnyvale, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/334,121

(22) Filed: Jun. 15, 1999

(51) Int. Cl.$^7$ .......................... H01L 21/336; H01L 21/425
(52) U.S. Cl. ...................... 438/286; 438/302; 438/305; 438/525; 438/527
(58) Field of Search ..................................... 438/301, 302, 438/305, 525, 527, 286

(56) References Cited

U.S. PATENT DOCUMENTS

| | | | |
|---|---|---|---|
| 5,364,807 | * | 11/1994 | Hwang . |
| 5,372,957 | * | 12/1994 | Liang et al. . |
| 5,510,279 | * | 4/1996 | Chien et al. . |
| 5,716,866 | * | 2/1998 | Dow et al. . |
| 5,759,901 | * | 6/1998 | Loh et al. . |
| 5,776,806 | * | 7/1998 | Dennison et al. . |
| 5,830,788 | * | 11/1998 | Hiroki et al. . |
| 5,926,712 | * | 7/1999 | Chen et al. . |
| 5,960,291 | * | 9/1999 | Krivokapic . |
| 6,022,785 | * | 2/2000 | Yeh et al. . |
| 6,063,673 | * | 5/2000 | Kao et al. . |
| 6,107,129 | * | 9/2000 | Gardner et al. . |

OTHER PUBLICATIONS

Bin Yu et al, Reverse Short–Channel Effects & Channel–Engineering in Deep–Submicron MOSET's : Modeling and Optimization, 1996 Symposium on VLSI Technology Digest of Technical Papers, pp. 162 & 163.

Bin Yu et al, Short–Channel Effect Improved by Lateral Channel–Engineering in Deep–Submicronmeter MOSET's, IEEE: Transactions on Electron Devices, vol. 44, No. 4, Apr. 1997, pp. 627–634.

* cited by examiner

Primary Examiner—Richard Booth
Assistant Examiner—Ron Pompey
(74) Attorney, Agent, or Firm—Lariviere, Grubman & Payne, LLP

(57) ABSTRACT

The inventive method and apparatus provides improved semiconductor devices, such as MOSFET's with a delayed threshold voltage roll-off and short channel effects, making the semiconductor devices more tolerant of gate variations for short gate length devices. The invention provides a semiconductor device with an asymmetric channel doping profile. A first pocket dopant implantation with a 0° tilt is used to create a first source dopant pocket and a drain dopant pocket. A second pocket dopant implantation with a 30–60° tilt creates a second source dopant pocket without creating an additional drain dopant pocket, thus creating the asymmetric doping profile.

11 Claims, 3 Drawing Sheets

MOS TRANSISTOR WITH DUAL POCKET IMPLANT

FIELD OF THE INVENTION

The present invention relates to MOSFET devices. Even more particularly, the present invention relates to ULSI MOSFET devices with a delayed threshold voltage roll-off.

BACKGROUND OF THE INVENTION

As the critical dimensions (CD) of ULSI MOSFET's keep shrinking, the channel doping profile becomes more critical. A good channel profile provides excellent immunity to short-channel effects, such as threshold voltage ($V_{th}$) roll-off and drain-induced-barrier-lowering, making the device very robust to random process variation (especially, gate length ($L_g$) variation). In a MOSFET with a uniformly doped channel (without channel doping engineering), the threshold voltage $V_{th}$ drops rapidly as gate length $L_g$ is reduced. In a MOSFET with conventional halo or pocket implant, the $V_{th}$ roll-off is delayed to some degree due to a "reverse short-channel effect" or "$V_{th}$ roll-up." The $V_{th}$ roll-up occurs because the "effective" or average channel doping concentration is raised as result of closer pocket peaks in the channel as the gate length $L_g$ gets shorter. However, when the two peaks of the pockets from the source side and drain side completely merge together, the average channel doping concentration no longer increases as $L_g$ decreases. Therefore, the threshold voltage $V_{th}$ starts to drop rapidly due to short-channel effects.

BRIEF SUMMARY OF THE INVENTION

It is an object of the invention to delay the rapid roll-off of the threshold voltage $V_{th}$ so that the threshold voltage $V_{th}$ drop occurs at a smaller gate length $L_g$.

It is another object of the invention to delay threshold voltage $V_{th}$ roll-off as gate length $L_g$ is reduced.

Accordingly, the foregoing objects are accomplished by creating a semiconductor device, comprising: a substrate with a surface; a gate oxide on the surface of the substrate; a gate on the gate oxide; a dielectric spacer adjacent to the gate oxide, the gate and the substrate; a source pocket extending into the substrate and under the oxide gate and on a source side of the gate, comprising: a first source dopant pocket extending into the substrate and under the dielectric spacer and oxide gate; and a second source dopant pocket extending under the dielectric spacer and further into the substrate and further under the oxide gate than the first source dopant pocket; a drain pocket extending into the substrate and under the dielectric spacer and the oxide gate and on a drain side of the gate, consisting of one and only one drain dopant pocket; a source extension extending into the substrate and under the dielectric spacer and the oxide gate on the source side of the gate; and a drain extension extending into the substrate and under the dielectric spacer and oxide gate on the drain side of the gate.

Other features of the present invention are disclosed or apparent in the section entitled: "DETAILED DESCRIPTION OF THE INVENTION."

BRIEF DESCRIPTION OF DRAWINGS

For a fuller understanding of the present invention, reference is made to the accompanying drawings wherein.

Figure 1:
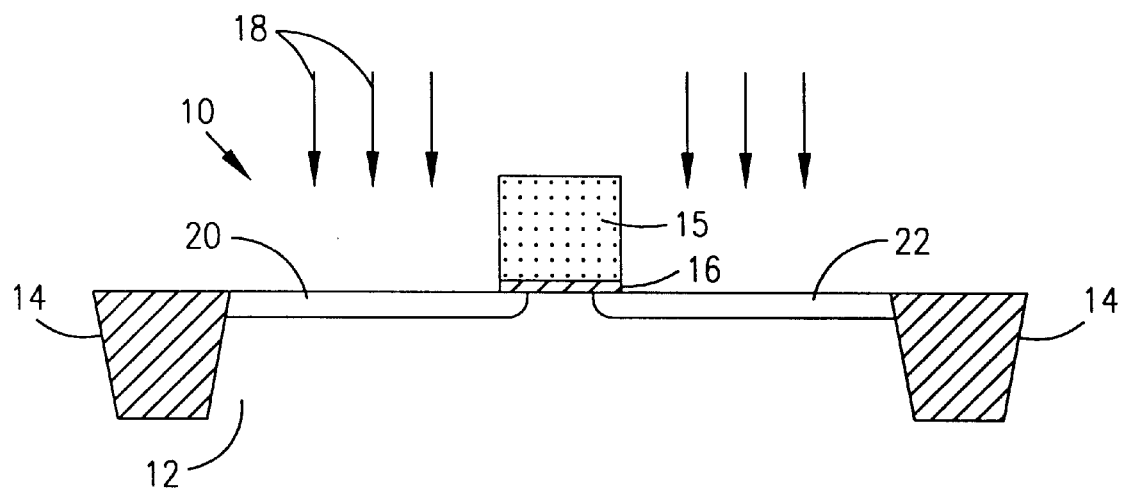
FIG. 1 is a schematic view of a substrate with the first phase of a MOSFET being formed according to an embodiment of the invention.

Reference numbers refer to the same or equivalent parts of the present invention throughout the several figures of the drawing.

DETAILED DESCRIPTION OF THE INVENTION AND BEST MODE OF THE INVENTION

FIG. 1 is a schematic view of part of a substrate 12 and the first phase of a MOSFET 10 being formed on the substrate 12. Isolation trenches 14 are etched into the surface of the substrate 12. The first phase of the MOSFET 10 has a gate 15 placed on a gate oxide 16 placed on the surface of the substrate 12. First pockets of dopant are created by a low energy first pocket dopant implantation 18 (ion implantation) with a 0° tilt, followed by an anneal and drive-in, which in the preferred embodiment heats the substrate 12 to a temperature of 800–1,000° C. to drive the implanted dopant further into substrate 12, which drives the dopant into the channel under the gate oxide 16. In the preferred embodiment the low energy first pocket dopant implantation 18 is a 5–10 KeV Boron implantation for an N-channel MOSFET. The first pocket dopant implantation 18 forms a first source dopant pocket 20 and a drain dopant pocket 22. The drive-in causes the implanted dopants to spread so that the first source dopant pocket 20 and the drain dopant pocket 22 extend under the gate oxide 16, as shown in FIG. 1. The 0° tilt is defined as the angle between the direction of travel of the dopant and the normal to the surface of the substrate 12 being 0°, with an error tolerance of ±2°.

Figure 2:
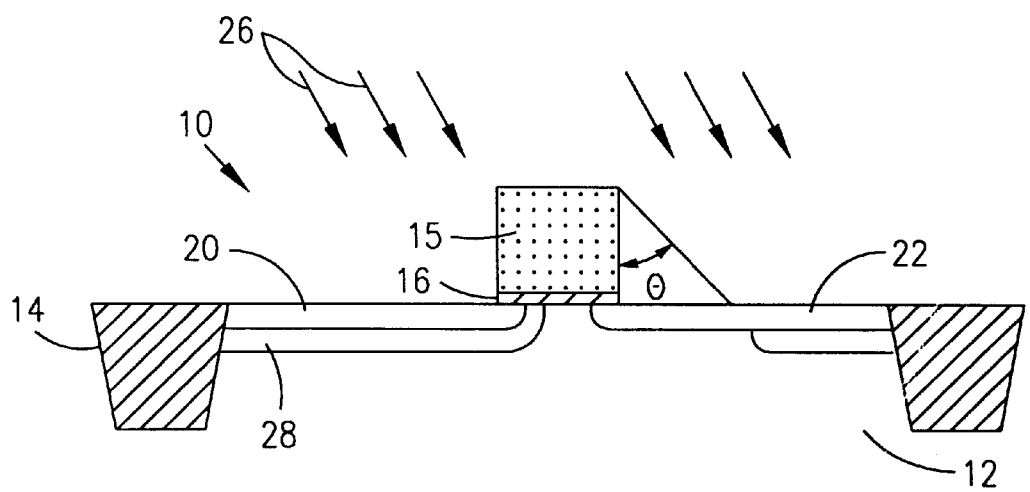
FIG. 2 is a schematic view of the MOSFET in FIG. 1 undergoing a dopant implantation with a tilt of 30–60°.

A second pocket dopant implantation 26 with a 30–60° tilt towards the drain is used to implant dopants to form a second source dopant pocket 28, as shown in FIG. 2. The energy of the second pocket dopant implantation 26 is greater than the energy of the first pocket dopant implantation 18, causing the second source dopant pocket 28 to be deeper than the first source dopant pocket 20, as shown. In the preferred embodiment, the deeper second pocket dopant implantation 26 is a 10–20 KeV Boron implantation for an N-channel MOSFET. The 30–60° tilt towards the drain is defined as the angle between the direction of travel of the dopant and the normal to the surface of the substrate 12 is 30–60°, illustrated in FIG. 2 as θ, and as the dopant travels towards the surface of the substrate the dopant also travels in the direction from the first source dopant pocket 20 to the drain dopant pocket 22, as shown. Because of the tilt of the implantation and shadowing caused by the gate 15, a deep second pocket is not implanted in the drain side of the channel region near the gate 15. The first source dopant pocket 20 and the second source dopant pocket 28 form a source pocket. The drain dopant pocket 22 forms a drain pocket. Therefore, the transistor has an asymmetrical channel doping profile.

Figure 3:
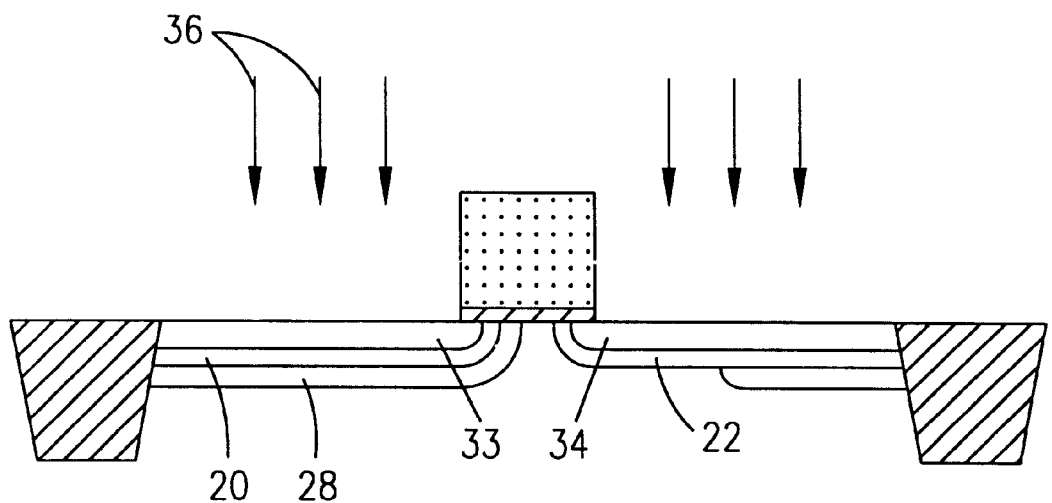
FIG. 3 is a schematic view of the MOSFET in FIG. 2 undergoing a source/drain extension dopant implantation.
Figure 4:
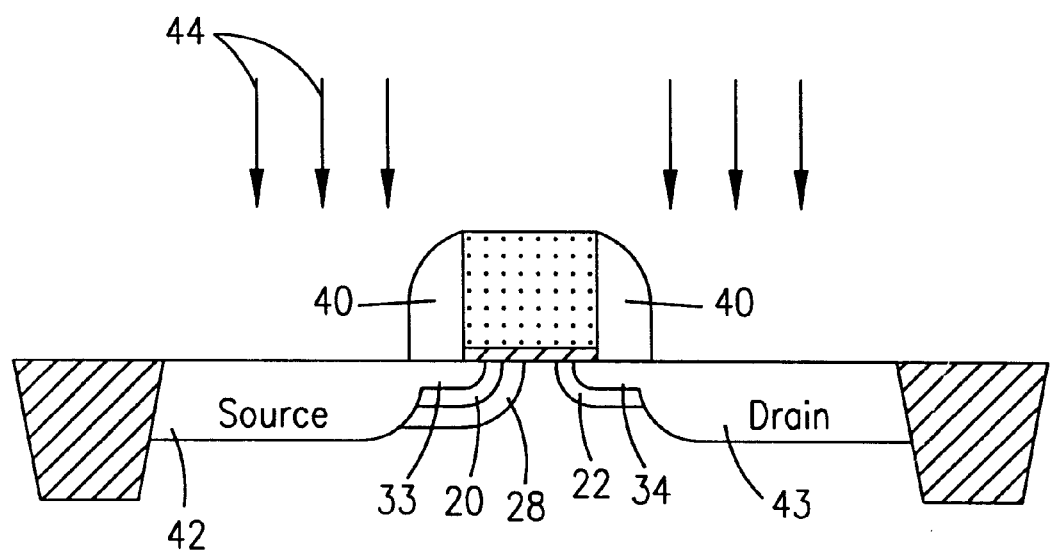
FIG. 4 is a schematic view of the MOSFET in FIG. 3 undergoing a source/drain junction dopant implantation.

A source extension 33 and a drain extension 34 are created by a low energy source/drain extension dopant implantation 36 with a 0° tilt (a vertical implant), as shown in FIG. 3. In the preferred embodiment, the low energy source/drain dopant implantation 26 is a 1–3 KeV Boron implantation for an N-channel MOSFET. Because of the low energy of the source/drain extension dopant implantation 36, the resulting source extension 33 and drain extension 34 are shallower than the first source dopant pocket 20, second source dopant pocket 28, and drain dopant pocket 22. A dielectric spacer 40 is formed on the sides of the gate 15 and gate oxide 16, as shown in FIG. 4. In the preferred embodiment, the deposit-and-etch-back process using a low temperature chemical vapor deposition at less than 400° C. is used to form a dielectric spacer 40, which is made of silicon oxide or silicon nitride. After the formation of the dielectric spacer 40, a deep source junction 42 and a deep drain junction 43 are formed by a source/drain junction dopant implantation 44. The MOSFET is subjected to a high temperature rapid thermal anneal, preferably at a temperature of 1000–1200° C., to activate the dopant in the deep source junction 42, the deep drain junction 43, the source extension 33, the drain extension 34, the second source dopant pocket 28 and the channel.

Conventional MOSFET processing is done to form the MOSFET structure 10 into a completed MOSFET.

Figure 5:
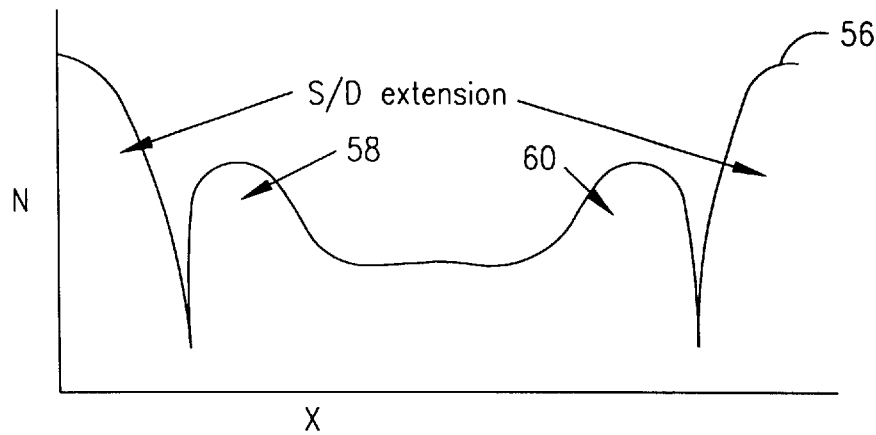
FIG. 5 is a graph of the lateral channel doping profile of a MOSFET with the prior art pocket implant.

FIG. 5 is a graph of the lateral channel doping profile 56 of a MOSFET with the prior art pocket implant, which plots the concentration of dopant N versus distance x along the length of the MOSFET. The doping profile 56 shows a source pocket implant 58 and a drain pocket implant 60, which are symmetrical.

Figure 6:
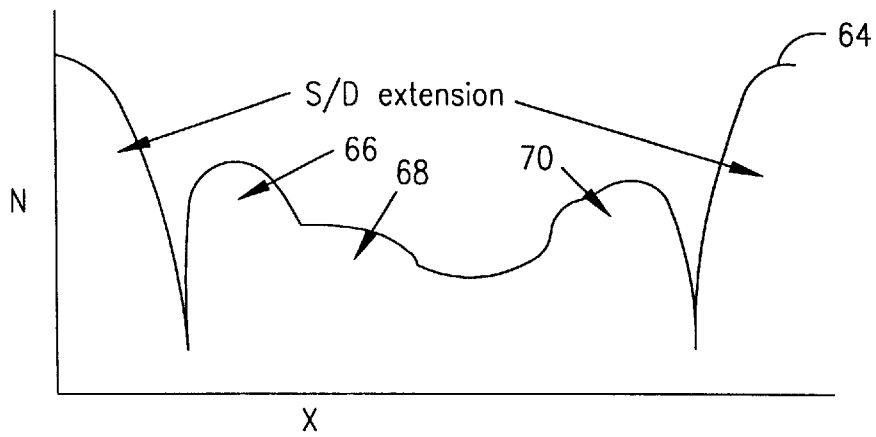
FIG. 6 is a graph of the lateral channel doping profile of a MOSFET with the inventive dual pocket implant in the source side.

FIG. 6 is a graph of the lateral channel doping profile 64 of a MOSFET with the inventive dual pocket implant in the source side, which plots the concentration of dopant N versus the distance x along the length of the MOSFET. The doping profile 64 shows a first source pocket implant 66, a second source pocket implant 68, and a drain pocket implant 70, which are asymmetrical.

Figure 7:
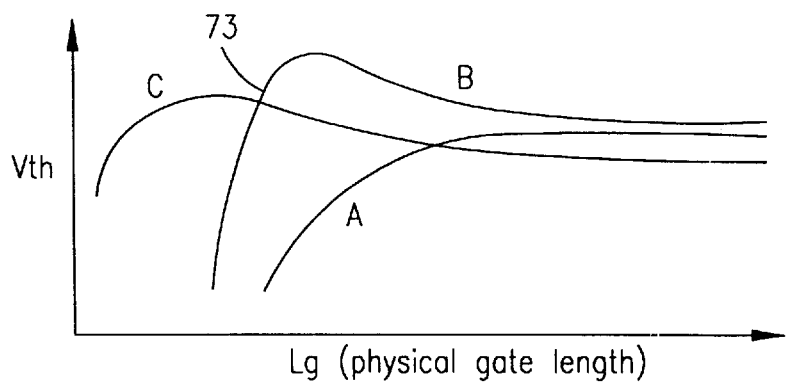
FIG. 7 is a graph of threshold voltage $V_{th}$ versus the gate length $L_g$ for the different channel doping profiles.

FIG. 7 demonstrates the threshold voltage roll-off in MOSFET's with different channel doping profiles by graphing threshold voltage $V_{th}$ versus the gate length $L_g$ for the different channel doping profiles. Curve A is the threshold voltage roll-off for a MOSFET with a uniformly doped channel (a channel without a channel doping profile engineering). For curve A, the threshold voltage drops rapidly as gate length is reduced. Curve B is the threshold roll-off for a MOSFET with conventional halo or pocket implant, which has a lateral channel doping profile illustrated by curve 56 in FIG. 5. The threshold voltage roll-off is delayed to some degree due to the effect of "reverse short-channel effect" or "threshold voltage roll-up". The threshold voltage roll-up occurs because the "effective" or average channel doping concentration is raised as a result of closer pocket peaks in the channel as the gate length gets shorter. However, when the two peaks of the pocket completely merge together, the average channel doping concentration no longer increases as gate length decreases, and the threshold voltage starts to drop rapidly due to the short-channel effect, as illustrated in curve B at point 73. Curve C is the threshold voltage roll-off for a MOSFET with the inventive second source pocket. In curve C, the short-channel effect is prevented for smaller gate lengths possibly down to a physical gate length of 50 nm. The invention can delay threshold voltage roll-off and short channel effects for gate lengths less than 100 nanometers (nm).

Information as herein shown and described in detail is fully capable of attaining the above-described object of the invention, it is understood that it is the presently preferred embodiment of the present invention and is thus representative of the subject matter which is broadly contemplated by the present invention, that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more." All structural and functional equivalents to the elements of the above-described preferred embodiment that are known or later come to be known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. 112, sixth paragraph, unless the element is expressly recited using the phrase "means for."

What is claimed is:

1. A method of producing an ULSI semiconductor device having an asymmetrical channel doping profile on a surface of a substrate for delaying a threshold voltage roll-off while minimizing a gate length, comprising the steps of: forming a gate oxide on the surface of the substrate;

forming a gate on the gate oxide, the gate having a first side and a second side opposite from the first side;

implanting a first dopant into the substrate with a 0° tilt, thereby performing a first pocket dopant implantation, and thereby forming a first source pocket adjacent to the gate first side and a drain pocket adjacent to the gate second side;

asymmetrically implanting a second dopant into the substrate with a tilt in a range from 30° to 60°, thereby performing a second pocket dopant implantation, and thereby forming a second source pocket, said tilt being oriented from one of the two sides of the gate;

implanting a source/drain extension dopant into the substrate with a 0° tilt, thereby performing a source/drain extension dopant implantation in a range of 1 to 3 KeV, thereby forming a source extension and a drain extension, and thereby forming said asymmetrical channel doping profile on said surface of said substrate, wherein said first, second and source/drain extension dopant comprise a same conductivity type, whereby said asymmetrical channel doping profile facilitates distancing a peak of said source pocket from a peak of said drain pocket for delaying said threshold voltage roll-off while minimizing said gate length;

forming a dielectric spacer on the sides of the gate;

annealing the substrate; and completing formation of said semiconductor device.

2. The method, as recited in claim 1, further comprising the step of initially annealing and driving said first dopant from the first pocket dopant implantation into the substrate before performing said second dopant implantation.

3. The method, as recited in claim 2, wherein the step of annealing the substrate comprises a rapid thermal annealing of said second dopant from the second pocket dopant implantation and said second source/drain extension dopant from the source/drain extension dopant implantation into the substrate.

4. The method, as recited in claim 3, further comprising the step of subjecting the substrate to a deep source/drain region dopant implantation with a 0° tilt, and thereby forming a source region and a drain region after the step of forming the dielectric spacer and before the step of annealing the substrate.

5. The method, as recited in claim 4, further comprising the step of etching at least one isolation trench into the surface of the substrate, said trenches being spaced apart from the dielectric spacer so that the source region extends from at least one isolation trench to said dielectric spacer.

6. The method, as recited in claim 1,
wherein said first pocket dopant implantation is performed with an implantation energy in a range from 5 keV to 10 keV,
wherein said second pocket dopant implantation is performed with an implantation energy in a range from 10 keV to 20 keV.

7. The method, as recited in claim 1,
wherein said device comprises an N-channel MOSFET,
wherein said first dopant comprises Boron (B),
wherein said second dopant comprises Boron (B), and
wherein said source/drain extension dopant comprises Boron (B).

8. The method, as recited in claim 2, wherein said step of initially annealing and driving said first dopant is performed at a temperature in a range from 800° C. to 1000° C. before performing said second dopant implantation.

9. The method, as recited in claim 3, wherein said step of rapid thermal annealing of said second dopant and said second source/drain extension dopant is performed at a temperature in a range from 1000° C. to 1200° C.

10. The method, as recited in claim 1, wherein said step of forming said dielectric spacer is performed at a temperature in a range less than 400° C.

11. A method of producing an ULSI semiconductor device having an asymmetrical channel doping profile on a surface of a substrate for delaying a threshold voltage roll-off while minimizing a gate length, comprising the steps of:
forming a gate oxide on the surface of the substrate;
forming a gate on the gate oxide, the gate having a first side and a second side opposite from the first side;
implanting a first dopant into the substrate with a 0° tilt,
  thereby performing a first pocket dopant implantation, and
  thereby forming a first source pocket adjacent to the gate first side and a drain pocket adjacent to the gate second side;
initially annealing and driving said first dopant from the first pocket dopant implantation into the substrate;
asymmetrically implanting a second dopant into the substrate with a tilt in a range from 30° to 60°,
  thereby performing a second pocket dopant implantation, and
  thereby forming a second source pocket,
  said tilt being oriented from one of the two sides of the gate;
implanting a source/drain extension dopant into the substrate with a 0° tilt,
  thereby performing a source/drain extension dopant implantation,
  thereby forming a source extension and a drain extension, and
  thereby forming said asymmetrical channel doping profile on said surface of said substrate,
  whereby said asymmetrical channel doping profile facilitates distancing a peak of said source pocket from a peak of said drain pocket for delaying said threshold voltage roll-off while minimizing said gate length;
forming a dielectric spacer on the sides of the gate;
subjecting the substrate to a deep source/drain region dopant implantation with a 0° tilt, and thereby forming a source region and a drain region;
annealing the substrate;
etching at least one isolation trench into the surface of the substrate, said trenches being spaced apart from the dielectric spacer so that the source region extends from at least one isolation trench to said dielectric spacer; and
completing formation of said semiconductor device,
wherein the step of annealing the substrate comprises a rapid thermal annealing of said second dopant from the second pocket dopant implantation and said second source/drain extension dopant from the source/drain extension dopant implantation into the substrate,
wherein said first pocket dopant implantation is performed with an implantation energy in a range from 5 keV to 10 keV,
wherein said second pocket dopant implantation is performed with an implantation energy in a range from 10 keV to 20 keV,
wherein said source/drain extension dopant implantation is performed with an implantation energy in a range from 1 keV to 3 keV,
wherein said device comprises an N-channel MOSFET,
wherein said first dopant comprises Boron (B),
wherein said second dopant comprises Boron (B), and
wherein said source/drain extension dopant comprises Boron (B),
wherein said step of initially annealing and driving said first dopant is performed at a temperature in a range from 800° C. to 1000° C. before performing said second dopant implantation,
wherein said step of rapid thermal annealing of said second dopant and said second source/drain extension dopant is performed at a temperature in a range from 1000° C. to 1200° C., and
wherein said step of forming said dielectric spacer is performed at a temperature in a range less than 400° C.

* * * * *

UNITED STATES PATENT AND TRADEMARK OFFICE
CERTIFICATE OF CORRECTION

PATENT NO. : 6,255,174 B1
DATED : July 3, 2001
INVENTOR(S) : Bin Yu

It is certified that error appears in the above-identified patent and that said Letters Patent is hereby corrected as shown below:

Column 1,
Line 11, delete [MOSFET's] and replace with -- MOSFETs --.

Column 3,
Line 40, delete [MOSFET's] and replace with -- MOSFETs --.

Signed and Sealed this

Fifteenth Day of January, 2002

Attest:

Attesting Officer

JAMES E. ROGAN
Director of the United States Patent and Trademark Office